United States Patent
Rahim et al.

(10) Patent No.: US 11,079,282 B2
(45) Date of Patent: Aug. 3, 2021

(54) FLEXIBLE INTERCONNECT SENSING DEVICES AND RELATED METHODS

(71) Applicant: SEMICONDUCTOR COMPONENTS INDUSTRIES, LLC, Phoenix, AZ (US)

(72) Inventors: Irfan Rahim, Milpitas, CA (US); Oswald L. Skeete, Phoenix, AZ (US); Ross F. Jatou, San Jose, CA (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 9 days.

(21) Appl. No.: 16/202,953

(22) Filed: Nov. 28, 2018

(65) Prior Publication Data
US 2020/0166410 A1   May 28, 2020

(51) Int. Cl.
*G01J 5/20* (2006.01)
*H04N 5/33* (2006.01)
*H01L 27/146* (2006.01)

(52) U.S. Cl.
CPC .......... *G01J 5/20* (2013.01); *H01L 27/14636* (2013.01); *H01L 27/14643* (2013.01); *H01L 27/14689* (2013.01); *H04N 5/33* (2013.01)

(58) Field of Classification Search
CPC . G01T 1/20; H01L 27/14609; H01L 23/5387; H01L 27/14636; H01L 27/14618; H01L 27/14663; H01L 24/16; H01L 27/14643; H01L 27/14689; H01L 27/14625; H01L 27/14621; H01L 27/14627; H01L 27/14683; H01L 27/14685; H01L 27/1469; G01J 5/20; H04N 5/33
See application file for complete search history.

(56) References Cited

U.S. PATENT DOCUMENTS

| 6,936,855 B1 * | 8/2005 | Harrah ...................... F21K 9/00 257/59 |
| 7,507,944 B1 * | 3/2009 | Arnzen ............. H01L 27/14603 250/208.1 |
| 2016/0163755 A1 * | 6/2016 | Huang ............. H01L 27/14625 257/459 |

OTHER PUBLICATIONS

Minco Products, Inc., Flex Circuits Design Guide, Doc # FCSG014, 2015, 32 pages.

* cited by examiner

*Primary Examiner* — Mouloucoulaye Inoussa
(74) *Attorney, Agent, or Firm* — Adam R. Stephenson, Ltd.

(57) ABSTRACT

Implementations of sensing devices may include a plurality of electromagnetic radiation sensing sections coupled to a flexible interconnect and one or more digital sections coupled to the flexible interconnect. The plurality of electromagnetic radiation sensing sections may be self-aligned through the flexible interconnect.

8 Claims, 14 Drawing Sheets

FLEXIBLE INTERCONNECT SENSING DEVICES AND RELATED METHODS

BACKGROUND

1. Technical Field

Aspects of this document relate generally to sensing devices, such as an image sensor. More specific implementations involve image sensors having a flexible interconnect.

2. Background

Various sensors convey information by communicating signals in response to incident electromagnetic radiation, such as light. Image sensors are a type of sensor and are used in a variety of devices including smart phones, digital cameras, night vision devices, medical imagers, and many others. Semiconductor imagers utilizing charge-coupled device (CCD) and complementary metal-oxide semiconductor (CMOS) architectures use semiconductor devices to respond to incident radiation.

SUMMARY

Implementations of sensing devices may include a plurality of electromagnetic radiation (EMR) sensing sections coupled to a flexible interconnect and one or more digital sections coupled to the flexible interconnect. The plurality of EMR sensing sections may be self-aligned through the flexible interconnect.

Implementations of sensing devices may include one, all, or any of the following:

The plurality of EMR sensing sections may include a plurality of image sensing sections.

The plurality of image sensing sections may include a plurality of pixel arrays coupled an analog circuit.

The one or more digital sections may be only one digital section.

The flexible interconnect may be rolled back in contact with itself

Implementations of sensing devices may include a plurality of EMR sensing sections coupled to a flexible interconnect including a piecewise linear curve and at least one digital section coupled to the flexible interconnect. Each EMR sensing section of the plurality of EMR sensing sections may be coupled over a substantially straight portion of the flexible interconnect. The flexible interconnect may be bent only at portions of the flexible interconnect between the substantially straight portions of the flexible interconnect.

Implementations of sensing devices may include one, all, or any of the following:

Each EMR sensing section may be stacked over a corresponding digital section.

The EMR sensing section may include an analog section and a pixel array.

The pixel array may be hybrid bonded to an analog section.

The plurality of EMR sensing sections may be self-aligned through the flexible interconnect.

The plurality of EMR sensing sections may form a concave surface.

The at least one digital section may include only one digital section.

Implementations of methods of forming EMR sensing devices may include forming a plurality of EMR sensing die in a first side of substrate and forming a trench partially through the substrate from the first side of the substrate through removing a portion of the substrate between two EMR sensing die of the plurality of EMR sensing die. The method may also include coupling a support layer to the first side of the substrate, singulating the plurality of EMR sensing die through thinning a second side of the substrate opposite the first side of the substrate, and coupling the second side of the substrate to a flexible interconnect. The method may also include removing at least a portion of the support layer to fully singulate the plurality of EMR sensing die and bending the flexible interconnect at portions of the flexible interconnect corresponding with a location of the trench.

Implementations of methods for forming EMR sensing devices may include one, all, or any of the following:

The substrate may include an EMR sensing layer hybrid bonded to an analog layer. The first side of the substrate may include a side of the EMR sensing layer and the second side of the substrate may include a side of the analog layer.

The method may include forming a through-silicon-via at least partially through the analog layer and exposing the through-silicon-via when thinning the second side of the substrate.

The method may include forming the trench through patterning a photoresist layer over the first side of the substrate and etching into the first side of the substrate.

The plurality of EMR sensing die each may include a non-rectangular perimeter.

The method may include coupling a digital section to the flexible interconnect.

The EMR sensing device may include a complimentary metal-oxide semiconductor image sensor.

The method may include forming the flexible interconnect into a tube shape.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended sensing device will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such sensing devices, and implementing components and methods, consistent with the intended operation and methods.

Figure 1:
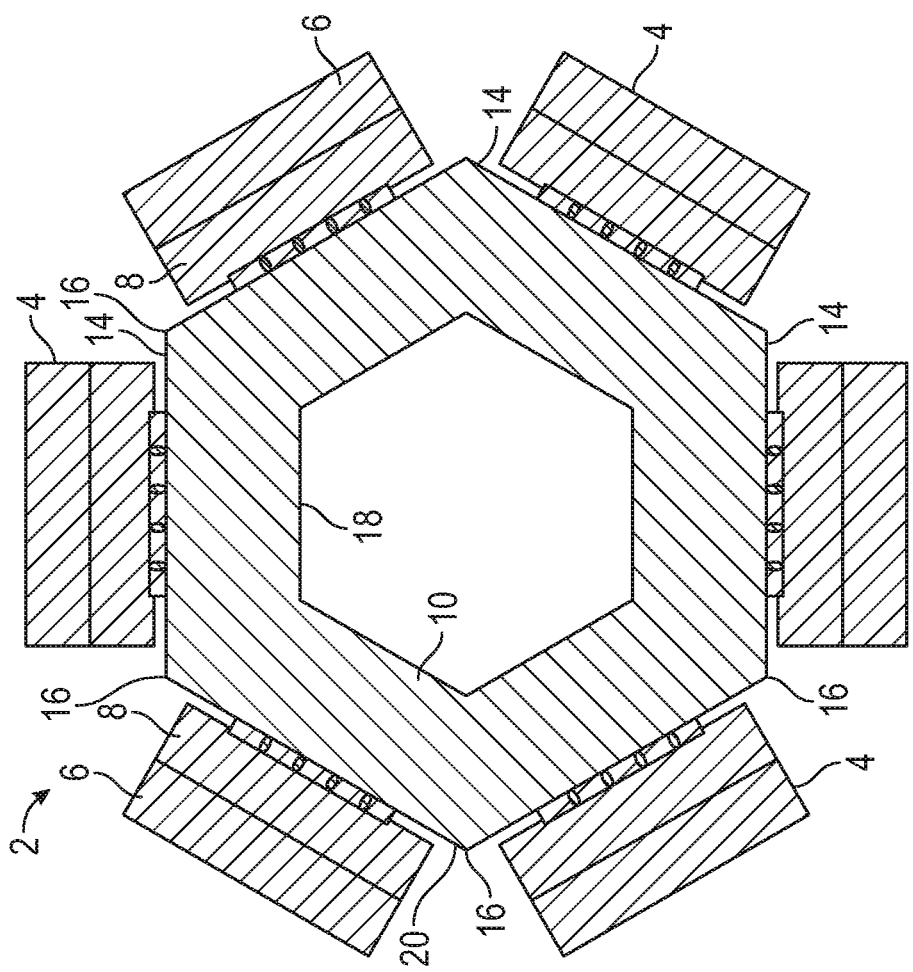
FIG. 1 is a top view of a sensing system.
Figure 7:
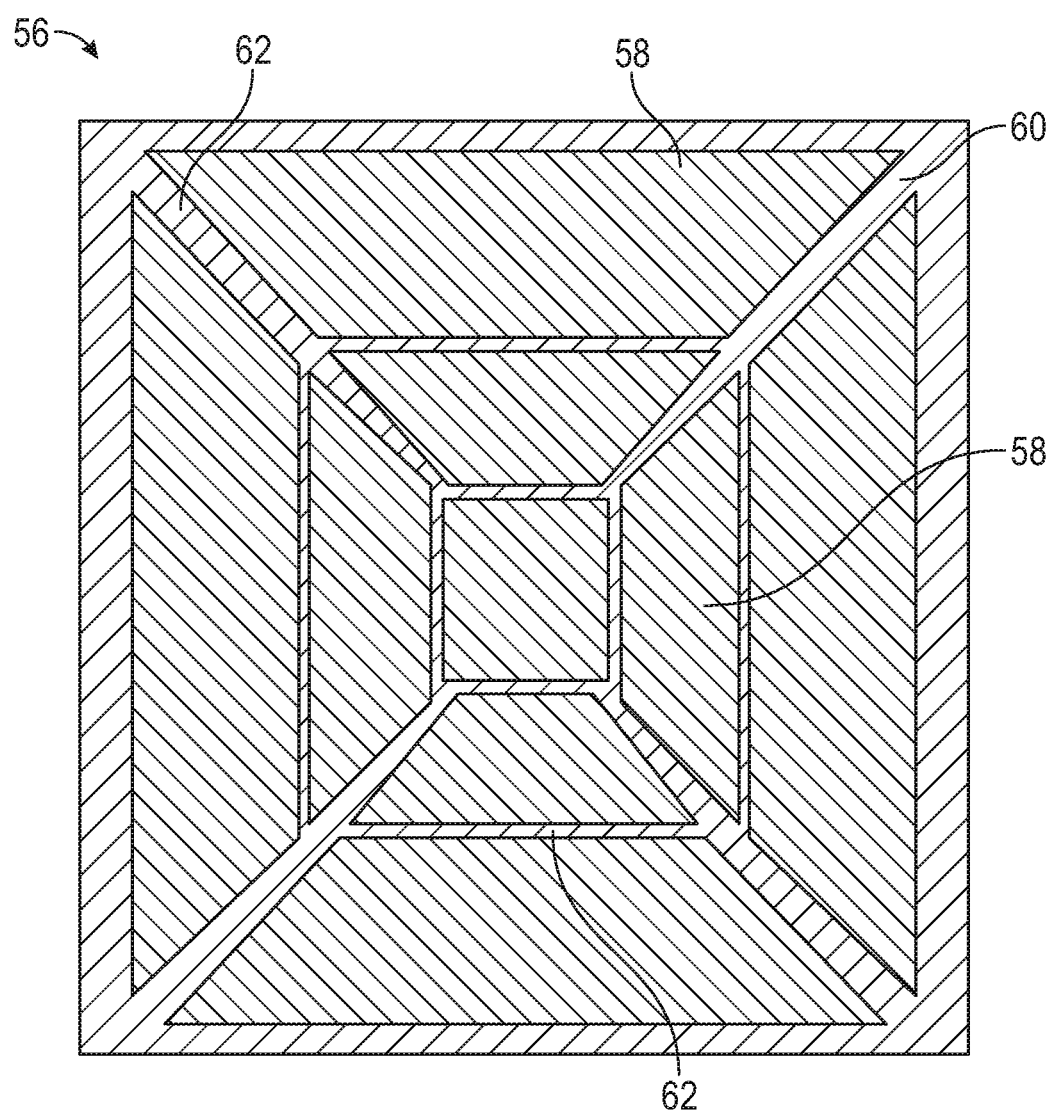
FIG. 7 is a top view of another implementation of a plurality of sensors in a sensing system.
Figure 8:
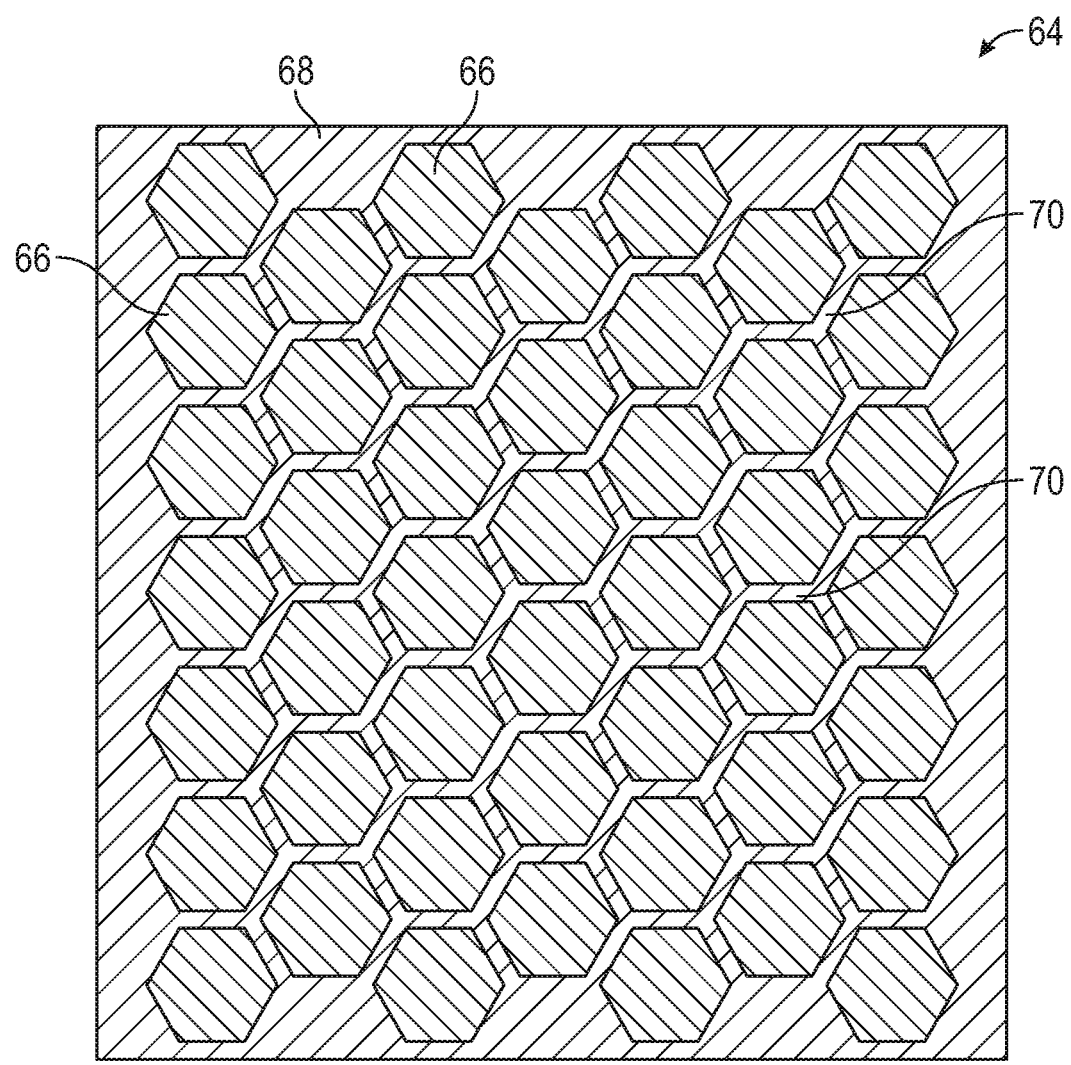
FIG. 8 is a top view of another implementation of a plurality of sensors in a sensing system.

Referring to FIG. 1, a top view of a sensing system is illustrated. The sensing system 2 includes a plurality of sensing sections 4. The sensing sections may be electromagnetic radiation (EMR) sensing sections. As used herein, EMR sensing sections are sections configured to sense EMR including, by non-limiting example, radio waves, microwaves, radar, light detection and ranging (LIDAR) radiation, infrared light, ultra-violet light, and/or visible light. Each sensing section may include a perimeter which may be a variety of shapes, including, by non-limiting example, a triangle, rectangle, square, circle, oval, quadrilateral, pentagon, hexagon, heptagon, octagon, nonagon, decagon, dodecahedron, or any other closed shape. Particular implementations of sensing sections having different shapes are illustrated in FIGS. 7-8. Each sensing section of the plurality of sensing sections 4 may be a semiconductor die. In various implementations, each sensing section may include an image sensor, and in particular implementations, a complementary metal oxide semiconductor (CMOS) image sensor (CIS).

In implementations including an image sensor, the image sensor may be, by non-limiting example, a complimentary metal-oxide semiconductor (CMOS) image sensor or a charge coupled device (CCD) image sensor. Further, in implementations including image sensors, such as is illustrated by FIG. 1, the image sensor may include a pixel array 6 comprising rows and columns of pixels. The pixel array 6 may be coupled over row and column circuitry 8. As described later herein, the pixel array 6 may be hybrid bonded to the column circuitry 8. In various implementations, the row and column circuitry 8 may include an analog portion. In various implementations, the analog portion may include digital components in addition to the analog components. In particular implementations, the analog portion may include a transducer. While various implementations disclosed herein may include image sensors, it is understood that other implementations of sensors may not include an image sensor but may utilize another sensor type, such as, by non-limiting example, a heat sensor, a humidity sensor, a sound sensor, and any other sensor type. Furthermore, any combination of different sensor types disclosed herein could be coupled together on the same flexible interconnect. In various implementations where different sensor types are coupled together through the same flexible interconnect they may also be self-aligned with one another through the flexible interconnect. In some implementations, electromagnetic radiation emitting components may be included on the same flexible interconnect as sensing components allowing for greater accuracy of sensing because of the self-alignment of the emitting and sensing components. In implementations where the emitting and sensing components are on the same flexible interconnect and arranged in a tubular, circular, or spherical array, the effect of mechanically rotating an array can be simulated by simply reading out sequentially/activating sequentially each desired one or more sensing/emitting components across the face of the array. The resulting data appears to rotate, but the sensing array would not have to mechanically rotate. This may be useful in LIDAR and RADAR applications.

Still referring to FIG. 1, the sensing device 2 includes a flexible interconnect 10 physically and electrically coupled to the plurality of sensing sections 4. In various implementations, the entirety of a length and a width or other dimension of the flexible interconnect 10 may be flexible. In other implementations, the flexible interconnect may include non-flexible rigid portions as well as flexible portions. The flexible interconnect 10 may be flexible in a single direction or in multiple directions. In particular implementations, the flexible interconnect 10 may be an interconnect manufactured under the trade name of MINCO by Minco of Minneapolis, Minn. In various implementations, the flexible interconnect 10 may include a plurality of holes. The flexible interconnect may include a stiffener. In various implementations, the flexible interconnect 10 may be a silicon interconnect thinned as to be flexible.

Figure 2:
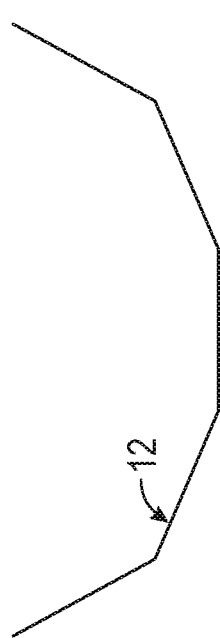
FIG. 2 is a side view of a piecewise linear curve.
Figure 6:
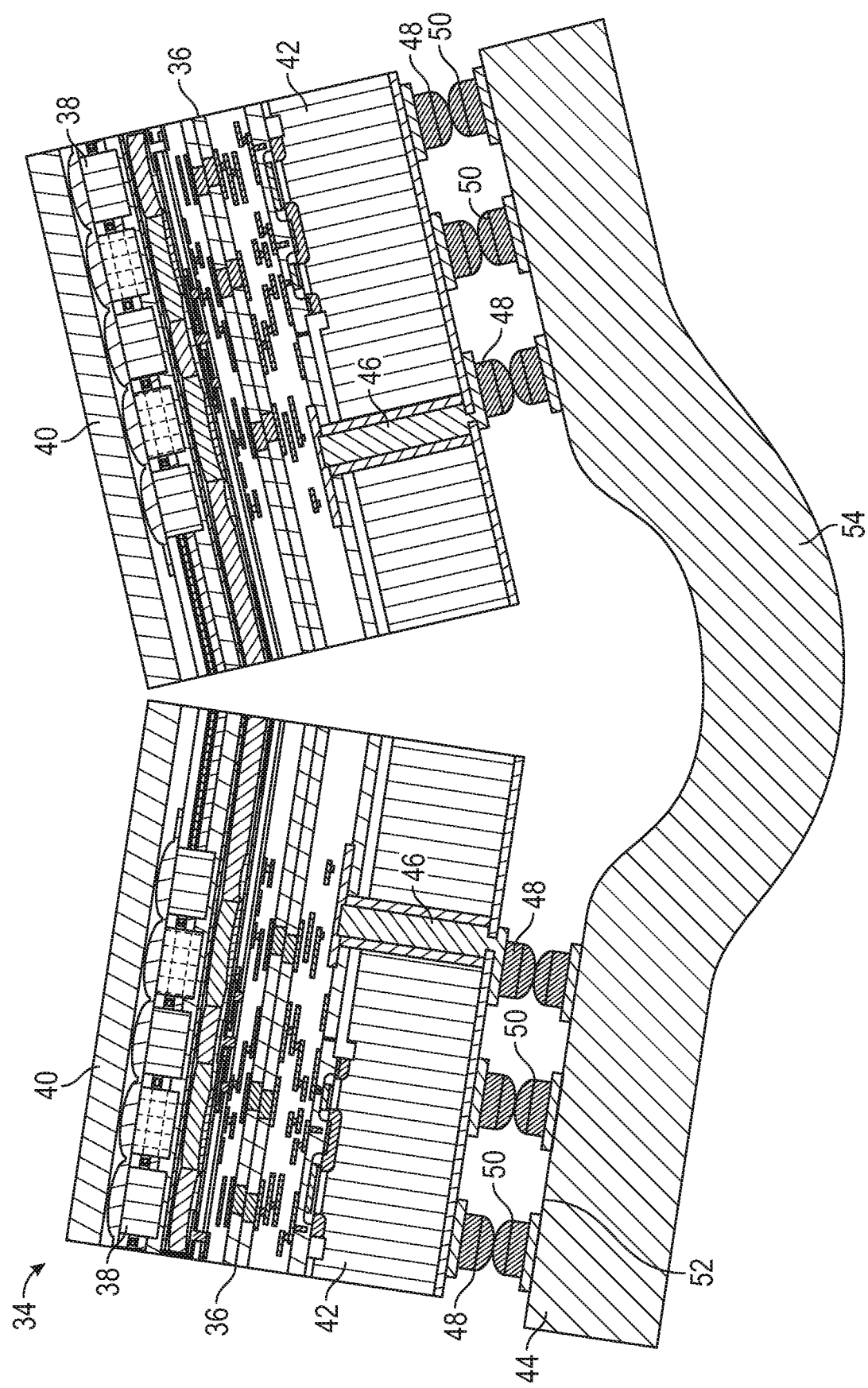
FIG. 6 is a side view of a plurality of sensing sections coupled to a flexible interconnect.

Referring to FIG. 2, a side view of a piecewise linear curve 12 is illustrated. In various implementations, the flexible interconnect may be configured to form a piecewise linear curve similar to curve 12. In such an implementation, the plurality of sensing sections may be coupled to either side of the curve, thus forming either a concave or convex sensing system. The flexible interconnect may be configured to include any number of bends/articulations with each bend being formed at various angles. Referring back to FIG. 1, the flexible interconnect 10 may be configured to form a piecewise linear curve and also be configured to roll back in contact with itself, thus forming the flexible interconnect 10 into a tube/roll shape. In various implementations, and as illustrated by FIG. 1, each sensing section of the plurality of sensing sections 4 is coupled over a substantially straight portion 14 of the flexible interconnect 10. Likewise, in such implementations, the flexible interconnect 10 is bent only at portions 16 of the flexible interconnect between the substantially straight portions 14 of the flexible interconnect. In implementations where not an entire surface of the sensing section is directly coupled to the flexible interconnect, a portion of a sensing section of the plurality of sensing sections 4 may be partially coupled over the bent portion 16 while the portions of the sensing section directly coupled to the flexible interconnect remain directly coupled to the substantially straight portions 14 (such as is illustrated by FIG. 6). In various implementations, though not illustrated, a substrate may be coupled to the side 18 of the flexible interconnect 10 opposite the side 20 of the flexible interconnect 10 coupled to the sensing sections 4. In such implementations, the substrate may be sufficiently rigid in order to help the flexible interconnect 10 maintain its shape.

Figure 3:
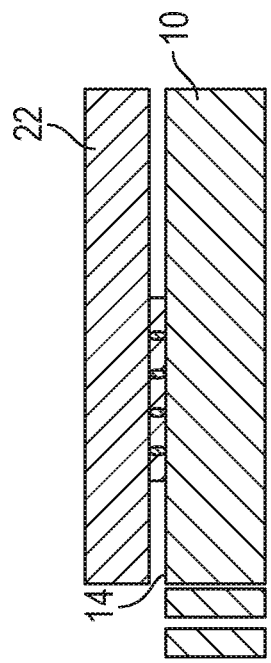
FIG. 3 is a side view of the digital section of a sensing system.

Referring to FIG. 3, a side view of the digital section of a sensing system is illustrated. As illustrated, the digital section 22 of FIG. 3 may be part of the same sensing system of FIG. 1. In various implementations, though not illustrated by FIG. 1, the sensing system may include one or more digital sections 22. In particular implementations, the digital section may be, by non-limiting example, a digital signal processor, a microprocessor, a digital logic circuit, or any other device capable of converting analog signals to digital and processing them. The digital section 22 may be physically and/or electrically coupled to the flexible interconnect 10. In particular implementations, the one or more digital sections 22 may be coupled over one or more substantially straight portions 14 of the flexible interconnect 10. In various implementations, and as illustrated by the sensing system of FIGS. 1 and 3-4, the one or more digital sections 22 are not stacked/located below a surface of the plurality of sensing sections 4. In other implementations, the sensing sections and digital sections may be stacked, or each sensing section may be directly coupled to and over a corresponding digital section, with the digital section between the sensing section and the flexible interconnect. In implementations where the digital section is not stacked with a corresponding sensing section, the sensing system may include more sensing sections than digital sections. In various implementations the sensing system may include a ratio of sensing sections to digital sections of, by non-limiting example, 2:1, 3:1, 6:1, 10:1, 100:1, or any other desired whole or fractional ratio. In implementations having fewer digital sections than sensing sections, as compared to implementations having a digital section for every sensing section, the sensing system may require less power as it requires the operation of fewer digital sections. Further, the cost of the sensing system may decrease as a single digital section may be used in conjunction with multiple sensing sections rather than requiring multiple digital sections for multiple sensing sections.

Figure 4:
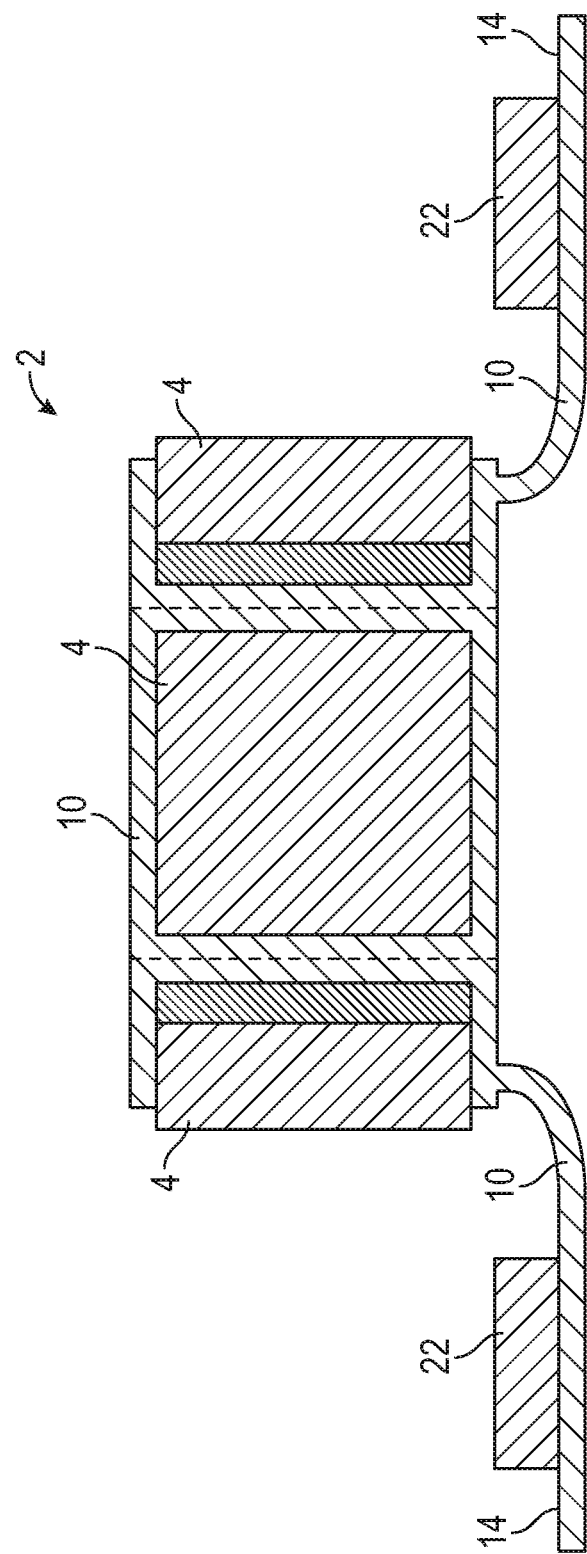
FIG. 4 is a side view of the sensing system of FIG. 1.

Referring to FIG. 4, a side view of the sensing system of FIG. 1 is illustrated. In various implementations, the one or more digital sections 22 may be coupled to a portion of the flexible interconnect 10 which is curved away/extends away from the portions of the flexible interconnect coupled to the sensing sections 4. As is illustrated by FIGS. 1 and 4, the ratio of sensing sections to digital sections may be 3:1. In such implementations, the curved sensing system may produce a continuous image as all of the sensing sections are adjacent to one another while the digital section is separated from the sensing sections. Through the use of image stitching methods, the images from each of the sensing sections can be joined together to form a single continuous image.

Figure 5:
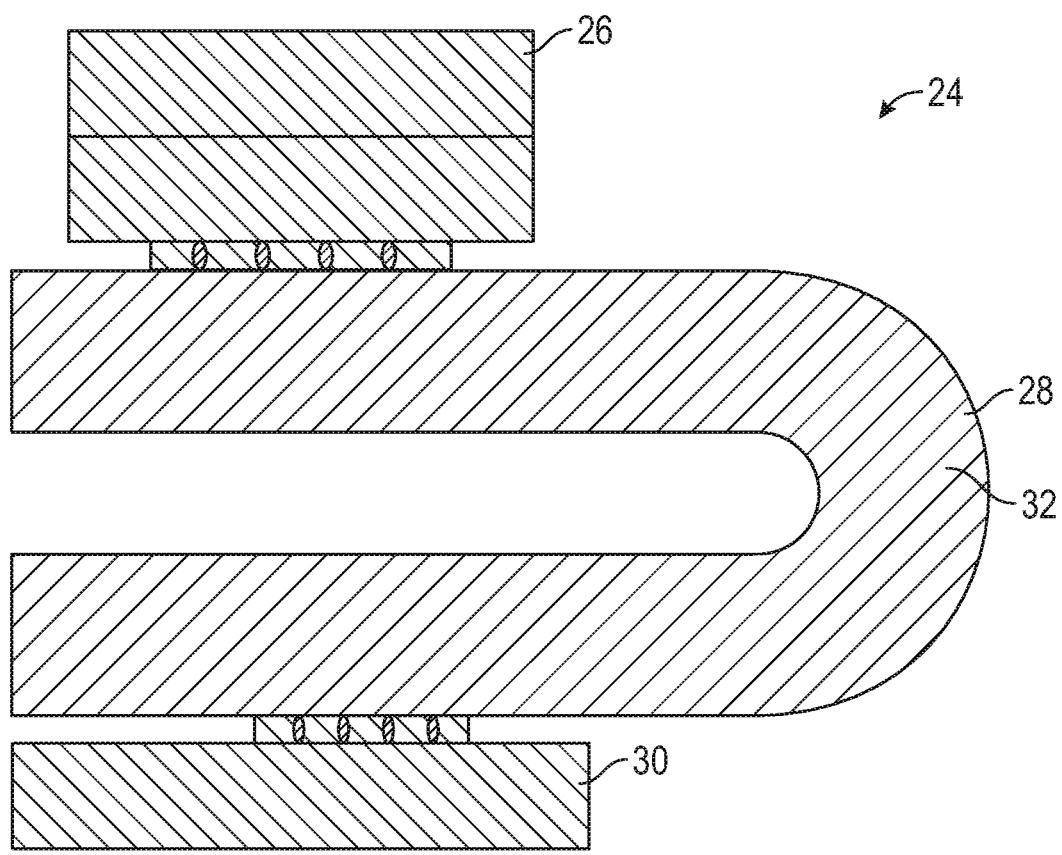
FIG. 5 is a view of another implementation of a portion of a sensing system.

Referring to FIG. 5, a view of another implementation of a portion of a sensing system is illustrated. The sensing system 24, as illustrated, includes at least one sensing section 26 which may be the same as or similar to any sensing section disclosed herein. While only a single sensing section 26 is illustrated, it is understood that the sensing system 24 may include more than a single sensing section 26. The sensing section 26 is coupled to a flexible interconnect 28 which may the same as or similar to any flexible interconnect disclosed herein. The sensing system 24 also includes a digital section 30 coupled to the flexible interconnect 28. The digital section 30 may include any digital section previously disclosed herein. As illustrated by FIG. 5, in various implementations the flexible interconnect may include a bend 32 of 180 degrees. In other implementations, the flexible interconnect may bend more or less than 180 degrees, including 90 degrees, 45 degrees, or any other angle. Further, the flexible interconnect may bend in only a single direction, while in other implementations, the flexible interconnect may bend and/or twist in multiple directions.

Referring to FIG. 6, a side view of a plurality of sensing sections coupled to a flexible interconnect is illustrated. As illustrated, the sensing system 34 includes at least two sensing sections 36. The sensing sections 36 may be the same as or similar to any sensing section disclosed herein. More specifically, the sensing sections 36 may be image sensing sections and each sensing section may be a semiconductor die. As illustrated, each sensing section 36 may include a pixel array 38. Each sensing section 36 may include an optically transmissive cover 40 coupled over the pixel array 38. In particular implementations the optically transmissive cover 40 may be glass, however, in other implementations, the cover may be a wide variety of materials, such as, by non-limiting example, plastic, polymers, silicon, ruby, sapphire, and any other optically transmissive material. In some implementations, the cover may be made of a material not transmissive to visible light, but to non-visible light or other wavelengths of electromagnetic radiation, such as, by non-limiting example, infrared light, ultraviolet light, radar, microwave, radio waves, or any other type of electromagnetic radiation. Other implementations of sensing systems disclosed herein may include the same or a similar optically transmissive cover. As illustrated, the use of the flexible interconnect with the defined distance between the sensors permits a precise angle between the pixel faces of the sensors to be set. As a result, the image perceived by the two sensors can be very accurately modeled and processed.

In various implementations, each sensing section 36 may include an analog portion 42 coupled between the pixel array and the flexible interconnect 44. While the implementations disclosed herein discuss an analog portion, it is understood that in other implementations the sensing system may include a digital portion in place of the analog portion. Further, in various implementations the analog portion may include digital elements. In various implementations, the analog portion 42 may include an ASIC. As illustrated, each pixel array 38 may be hybrid bonded to each analog portion 42. In such implementations, the hybrid bond may eliminate the need for a border of the analog portion extending beyond the pixel array to provide electrical connectivity from the pixel array to the analog portion, thus allowing the perimeter of the analog portion 42 to be commensurate in size and shape to the perimeter of the pixel array 38.

As illustrated by FIG. 6, each analog portion may include a via 46 coupling the analog portion to one or more contacts 48. By including a via 46 in each analog portion 42, each sensing section 36 need not include pads or wires to provide electrical connectivity to the flexible interconnect 44. As illustrated by FIG. 6, the one or more contacts 48 may include a plurality of bumps. In other implementations, the contacts may include a plurality of pads, pillars, pins, or any other electrical connector type (including combinations of various electrical connectors). The one or more contacts 48 may be coupled to one or more contacts 50 which are coupled to the flexible interconnect 44. In other implementations, the one or more contacts 48 may be directly coupled to the flexible interconnect 44. As illustrated by FIG. 6, each of the one or more contacts 48 and each of the one or more contacts 50 may be coupled over a substantially straight portion 52 of the flexible interconnect 44. The flexible interconnect 44 may include a bend portion 54. The bend portion may be bent at any angle. The flexible interconnect may be configured to bend only at the portions in between the substantially straight portions 52. As illustrated by FIG.

6, the bent portion 54 of the flexible interconnect 44 may be bent to create a concave or substantially concave sensing system (or form a concave surface), as illustrated by sensing system 34. In other implementations, the flexible interconnect may be bent to create a convex or substantially convex sensing system (or form a convex surface, an example of which is illustrated by FIG. 1). Though not illustrated, the sensing system 34 includes a digital section coupled to the sensing sections 36 through the flexible interconnect 44.

In various implementations, because the flexible interconnect is only bent at the portions between the substantially straight portions 52, and the sensing sections are only coupled to the substantially straight portions through the one or more contacts 48 and/or 50, the amount of strain on the sensing sections 36 (including the pixel array and any transistors) and the flexible interconnect 44 may be reduced as compared to an implementation having flexible interconnect continuously curved (rather than piecewise) and having the sensing sections directly coupled to the continuous curve through the one or more contacts 48 and/or 50. By reducing the stress of the flexible interconnect 44 and/or the sensing sections 36, the amount of dark current through the sensing system 34 may be reduced and the dynamic range of the sensing system may be correspondingly increased. By eliminating the stress on the silicon, the system also prevents changes to the transistor performance/characteristics of the pixel and/or other devices.

In various implementations, the sensing sections 36 may be self-aligned through the flexible interconnect 44. Contrary to having to align the sensing sections by picking and placing each sensing section upon a curved flexible interconnect, the sensing sections may be aligned through the bend in the flexible interconnect 44 as the flexible interconnect is bent after the sensing sections are already coupled to (or formed on) the flexible interconnect. By having the sensing sections 36 self-aligned (previously aligned through the flexible interconnect), each sensing section may produce an image which may be more accurately stitched with other images produced from other sensing sections in order to produce a single continuous image. By self-aligning the structure (distance between pixel arrays), the potential angles of the pixel arrays relative to each other (when they are bent over a surface as described herein) can be very precisely controlled allowing for much simpler image stitching.

Referring to FIG. 7, a top view of another implementation of a plurality of sensors in a sensing system is illustrated. As illustrated by FIG. 7, the sensing system includes a plurality of sensing sections 58 coupled to a flexible interconnect 60. The flexible interconnect may be configured to bend in order to substantially eliminate/close the gap 62 between the sensing sections 58. In other implementations, while the gap 62 may not be eliminated, the gap 62 may be of a consistent size between sensing sections, facilitating the stitching of any resulting images. In various implementations, the sensing system may be convex or concave. Referring to FIG. 8, a top view of another implementation of a plurality of sensors in a sensing system is illustrated. The sensing system 64 is similar to the sensing system 56 in that it includes a plurality of sensing sections 66 coupled to a flexible interconnect 68. The flexible interconnect may be configured to bend at portions of the flexible interconnect corresponding with the gaps 70 between the plurality of sensing sections 66. As illustrated by FIGS. 7-8, the plurality of sensing sections may include perimeters having a variety of shapes. The flexible interconnect may be bent based upon the shapes of the plurality of sensing sections to form various shapes of sensing systems. As an example, sensing section 64 of FIG. 8 may be bent according to the plurality of hexagonal sensing sections 66 to form a sensing system similar to a substantially semispherical or dome shape with the sensing sections 66 either on the interior or exterior of the dome shape. As can be seen in FIGS. 7-8, the die that contain the sensors may have various perimeter shapes like those disclosed herein and vary in size relative to one another.

While in some versions the flexible interconnect is fixedly coupled to a fixed support to create a permanent shape to the plurality of sensors, in other implementations, the flexible interconnect may be releasably or adjustable coupled to a support allowing position of the plurality of sensors to be adjusted as desired. In some implementations the flexible interconnect may not be coupled to a support but may be free to deflect under various forces, such as, by non-limiting example, air pressure, water pressure, vacuum, or other bulk forces. Such implementations permit real-time or substantially real-time adjustment to the image being detected by the array due to the mechanical movement of flexible interconnect.

Figure 9:
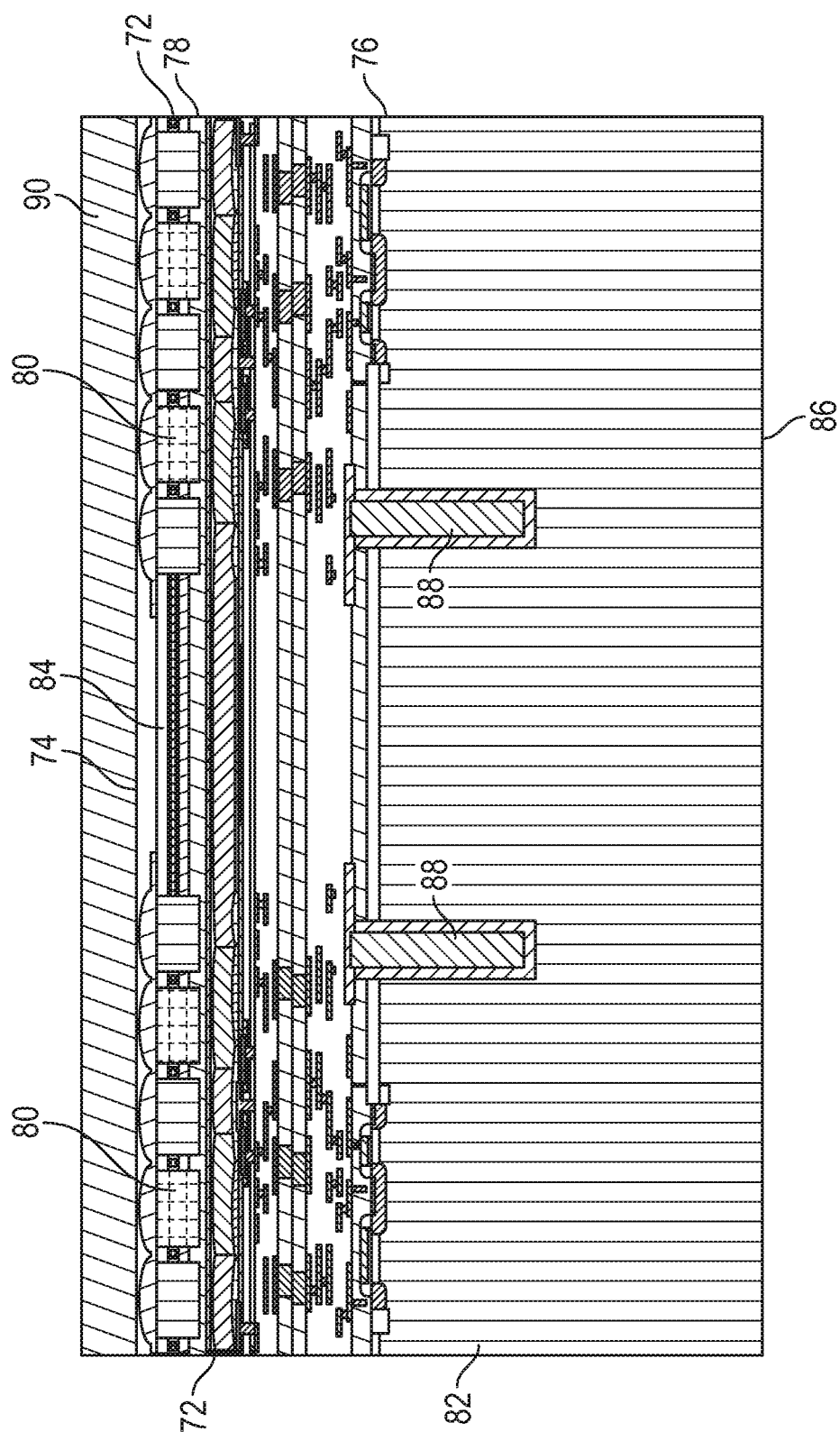
FIG. 9 is a side view of a plurality of sensing die formed in a substrate.

Referring to FIGS. 9-16, a method of forming the EMR sensing device similar to or the same as the EMR sensing device of FIG. 6 is illustrated. Variations of this method may be employed for any of the system implementations disclosed herein. Referring specifically to FIG. 9, a side view of a plurality of sensing die formed in a substrate is illustrated. In various implementations, the method of forming an EMR sensing die may include forming a plurality of EMR sensing die 72 in a first side 74 of a substrate 76. The EMR sensing die may be any type of EMR sensing die, and in various implementations may include any type of image sensor disclosed herein. The substrate may include an EMR sensing layer 78 configured to sense any form of EMR previously disclosed herein. The EMR sensing layer 78 may include a plurality of pixel arrays 80 which may be part of the plurality of EMR sensing die 72. As illustrated by FIG. 9, a space 84 may separate each EMR sensing die 72. In various implementations, the EMR sensing layer 78 may be coupled to an analog layer 82. In such implementations, the first side 74 of the substrate 76 may include a side of the EMR sensing layer 78 and a second side 86 opposite the first side of the substrate may include a side of the analog layer 82. In various implementations, the analog layer 82 may include a plurality of application specific integrated circuits (ASICs) which may form part of each image sensing die 72. In various implementations, and as illustrated by FIG. 9, the EMR sensing layer 78 may be hybrid bonded to the analog layer 82. The hybrid bonding may be carried out using any of a wide variety of bonding techniques and methods. The method of forming an EMR sensing device may include forming a plurality of through-silicon-vias 88 in the analog layer 82. The vias 88 extend at least partially through the analog layer. In various implementations, each EMR sensing die 72 may include a via 88. While the implementation disclosed by FIGS. 9-16 discuss an analog layer, in other implementations a digital layer may be in place of the analog layer 82. In still other implementations, the analog layer may be coupled over the digital layer. The method may also include coupling an optically transmissive cover 90 over the first side 74 of the substrate 76. The optically transmissive cover 90 may include any type of cover disclosed herein.

Figure 10:
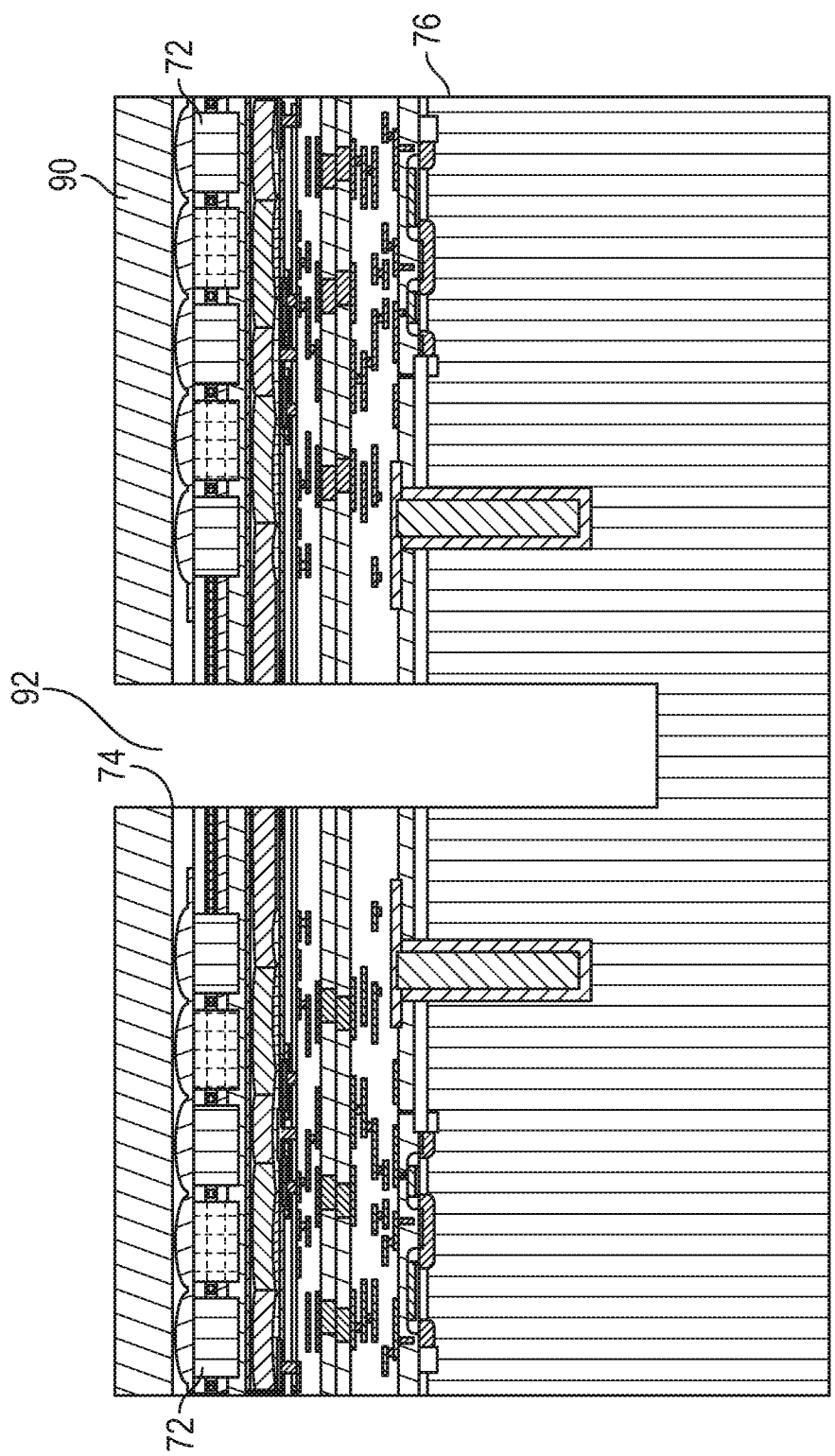
FIG. 10 is a side view of the substrate of FIG. 9 having a trench formed therein.

Referring to FIG. 10, a side view of the substrate of FIG. 9 having a trench formed therein is illustrated. In various implementations, the method for forming an EMR sensing device includes forming a trench 92 partially through the substrate from the first side of the substrate. The trench 92 may be formed through removing a portion of the substrate between two EMR sensing die of the plurality of EMR sensing die 72. In implementations having an optically transmissive cover 90, the method may also include forming the trench through the cover. The trench may be formed through, by non-limiting example, a saw, a water jet, a laser, a plasma etch, or a wet etch. In implementations forming the trench 92 through an etch, the trench need not be formed as a single straight line, which may ultimately result in perimeters of sensing sections of the device having a non-quadrilateral and non-triangular shape. In such implementations, the method may include patterning a photoresist layer over the first side of the substrate prior to etching. In particular implementations, the method may include forming the trench through wet etching through the EMR sensing layer and then depositing an oxide and plasma etching the remainder of the trench into the analog layer. In implementations using a wet etch, the wet etch may reduce damage to the substrate. In particular implementations, the trench may be 150 micrometers deep, however, in other implementations the trench may be deeper or shallower than 150 micrometers. The width of the trench may be the same as the width of the other trenches formed in the substrate. By controlling the width of the trenches formed, the spacing between the EMR sensing die coupled to the flexible interconnect may be consistent as the trenches formed become the spacing between the EMR sensing die. The ability to control the spacing between the die (or control the spacing of each trench) coupled with the ability to bend the interconnect, as described herein, allow for the die or sensing sections coupled to the flexible interconnect to be self-aligned, as described herein.

Figure 11:
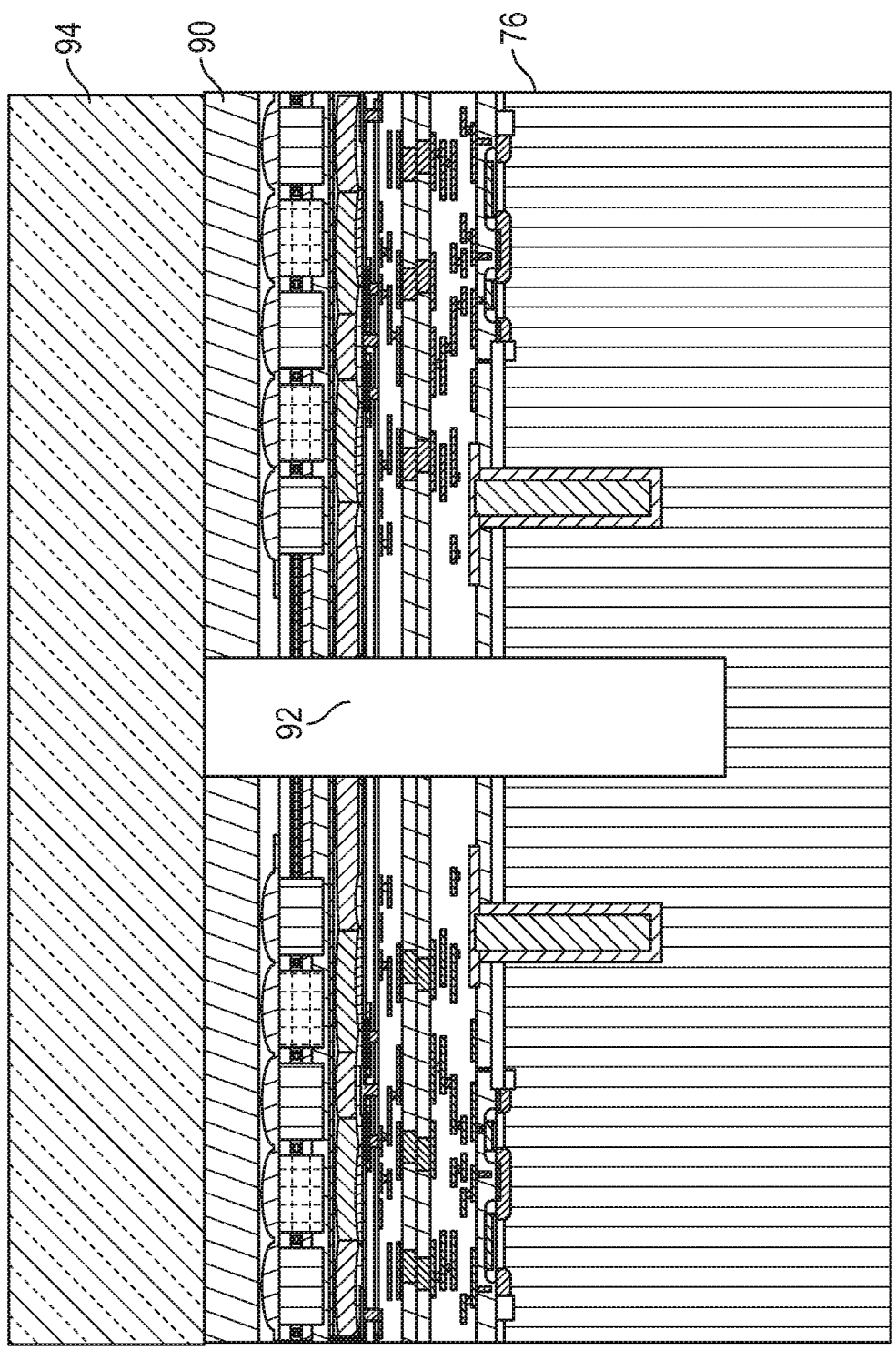
FIG. 11 is a side view of the substrate of FIG. 10 having a support layer coupled to the first side of the substrate.

While in the implementations illustrated in FIGS. 9-11 the trench 92 is formed prior to applying the support layer to the first side of the substrate, in other implementations, however, the trench 92 may be formed after thinning of the second side of the substrate after applying the support layer.

Referring to FIG. 11, a side view of the substrate of FIG. 10 having a support layer coupled to the first side of the substrate is illustrated. In various implementations, the method of forming the EMR sensing device may include coupling a support layer 94 to the first side of the substrate. In implementations having an optically transmissive cover, the support layer 94 may be coupled over the cover 90. In various implementations the support layer 94 may include glass, however, in other implementations the support layer may include any other rigid material. In other implementations, the support layer may be coupled over the front side before the trench is formed and the trench may be formed entirely through the substrate from the second side of the substrate. In such implementations, the vias may be exposed through the second side of the substrate. This may occur through the vias being formed entirely through the analog layer (thus, the method may not require that the substrate be thinned) or through thinning the substrate to expose the vias before forming the trench.

Figure 12:
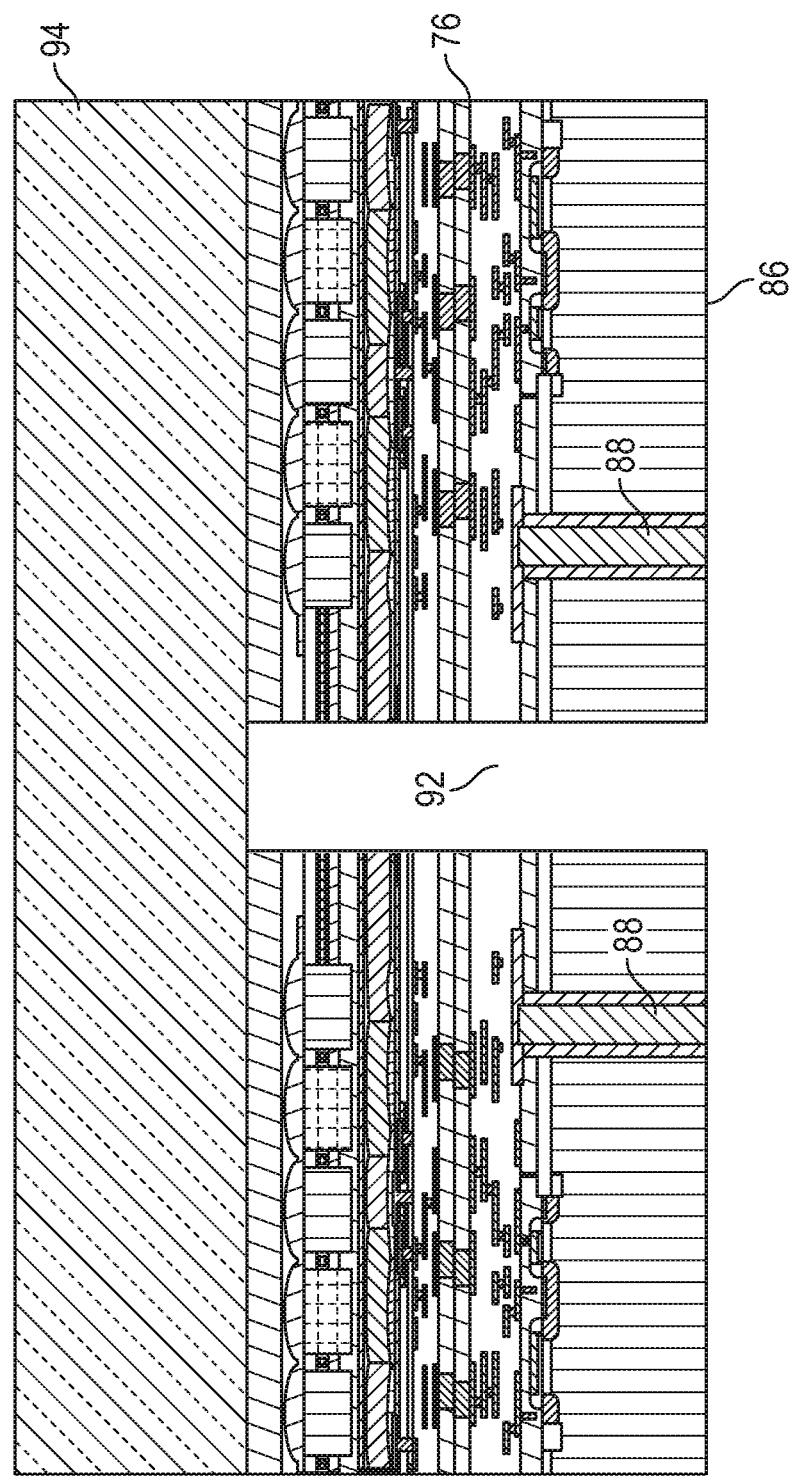
FIG. 12 is a side view of the substrate of FIG. 11 having a thinned second side of the substrate.

Referring to FIG. 12, a side view of the substrate of FIG. 11 having a thinned second side of the substrate is illustrated. In various implementations, the method may include singulating the plurality of EMR sensing die 72 through thinning the second side 86 of the substrate 76 opposite the first side 74 of the substrate. The substrate may be thinned until the channel 92 and the vias 88 are exposed from the second side 86 of the substrate. The second side 86 of the substrate 76 may be thinned through a grinding process, such as a backgrinding or a chemical-mechanical polish.

Figure 13:
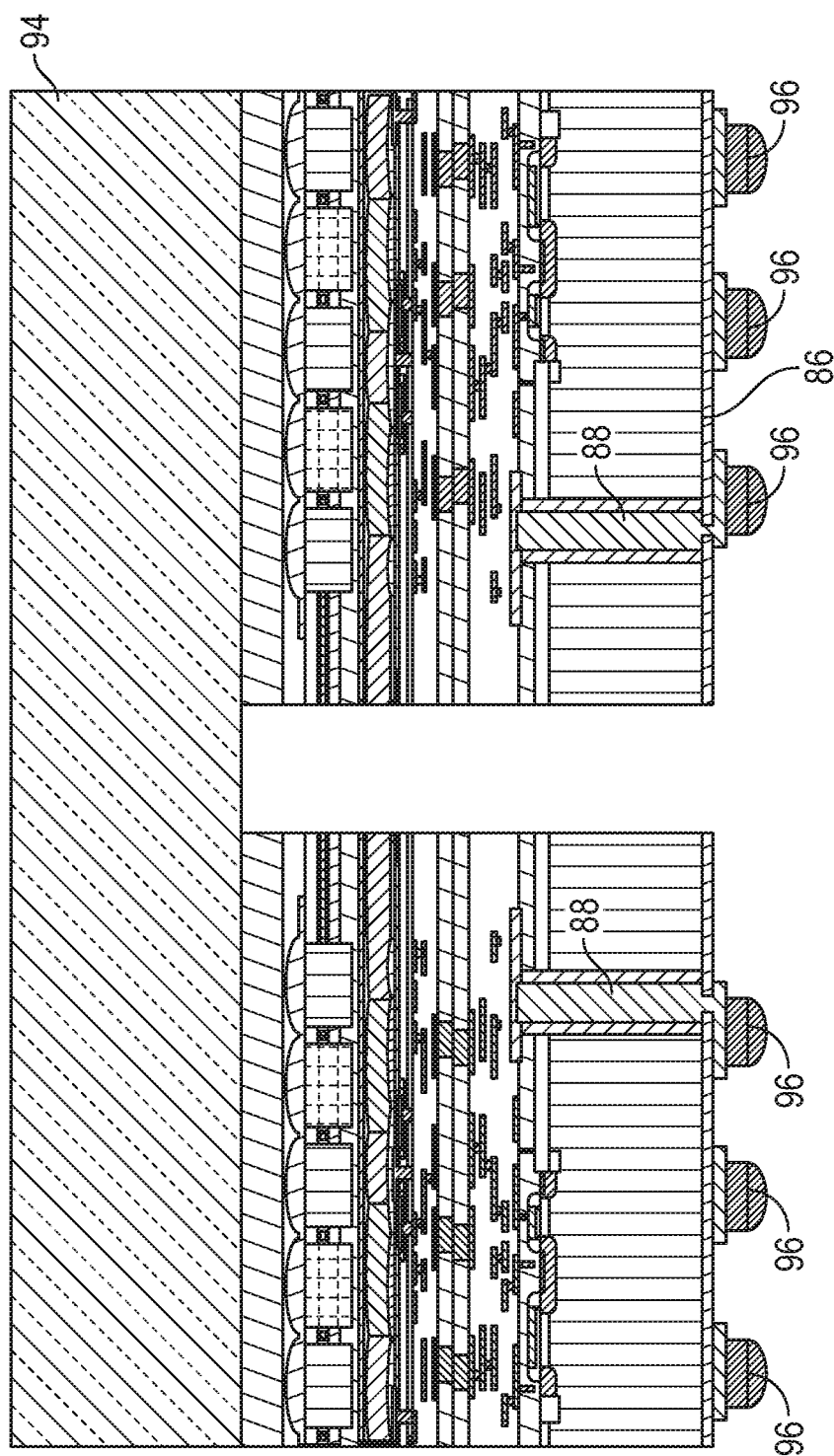
FIG. 13 is a side view of the substrate of FIG. 12 having a plurality of contacts formed on the second side of the substrate.

Referring to FIG. 13, a side view of the substrate of FIG. 12 having a plurality of contacts formed on the second side of the substrate is illustrated. In various implementations, the method of forming an EMR sensing device may include forming a plurality of contacts 96 on the second side 86 of the substrate 76. The plurality of contacts 96 may include any type of contact disclosed herein. In various implementations, the method may also include forming a redistribution layer between the plurality of contacts 96 and the EMR sensing die 72.

Figure 14:
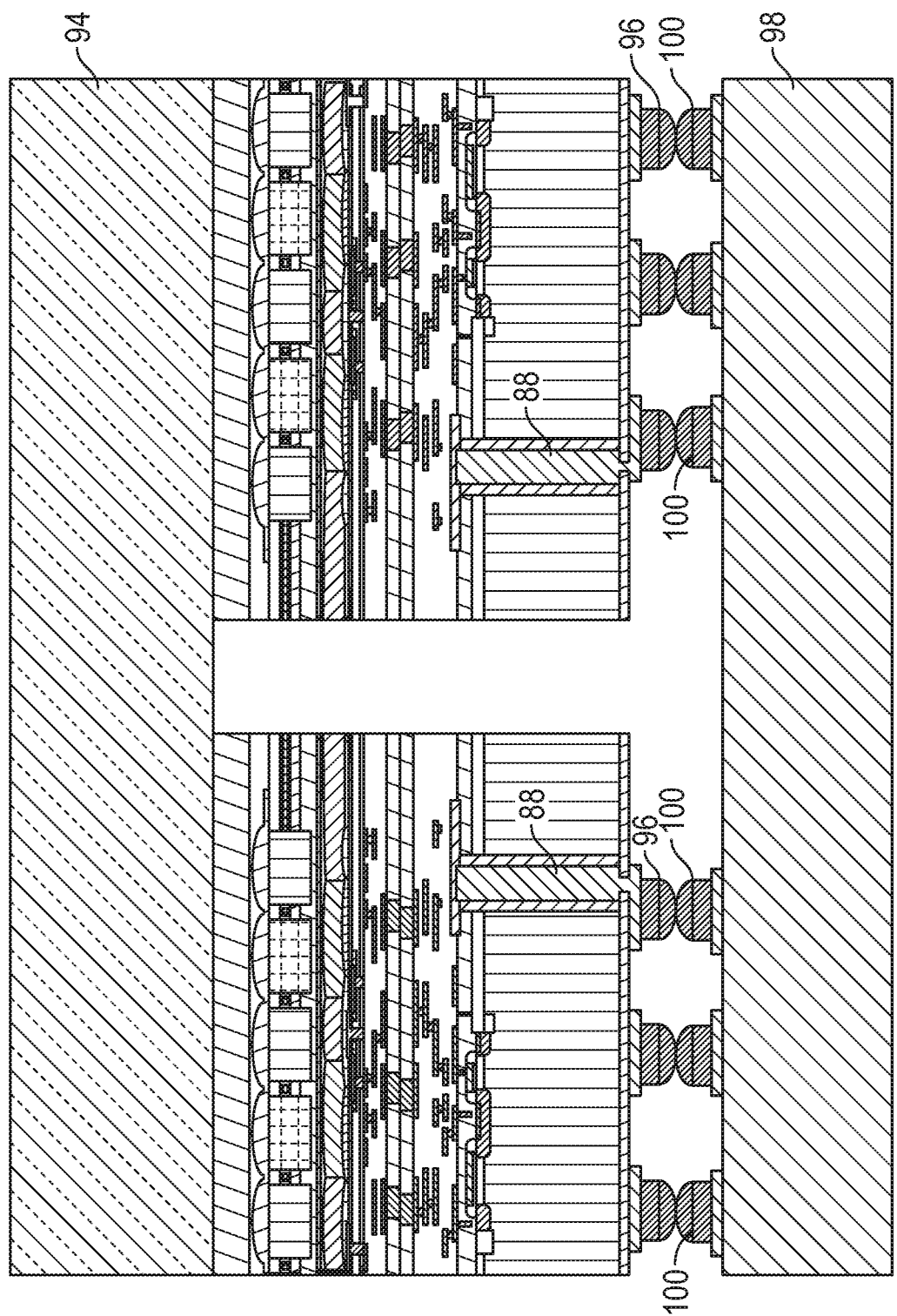
FIG. 14 is a side view of the substrate of FIG. 13 coupled to a flexible interconnect.
Figure 15:
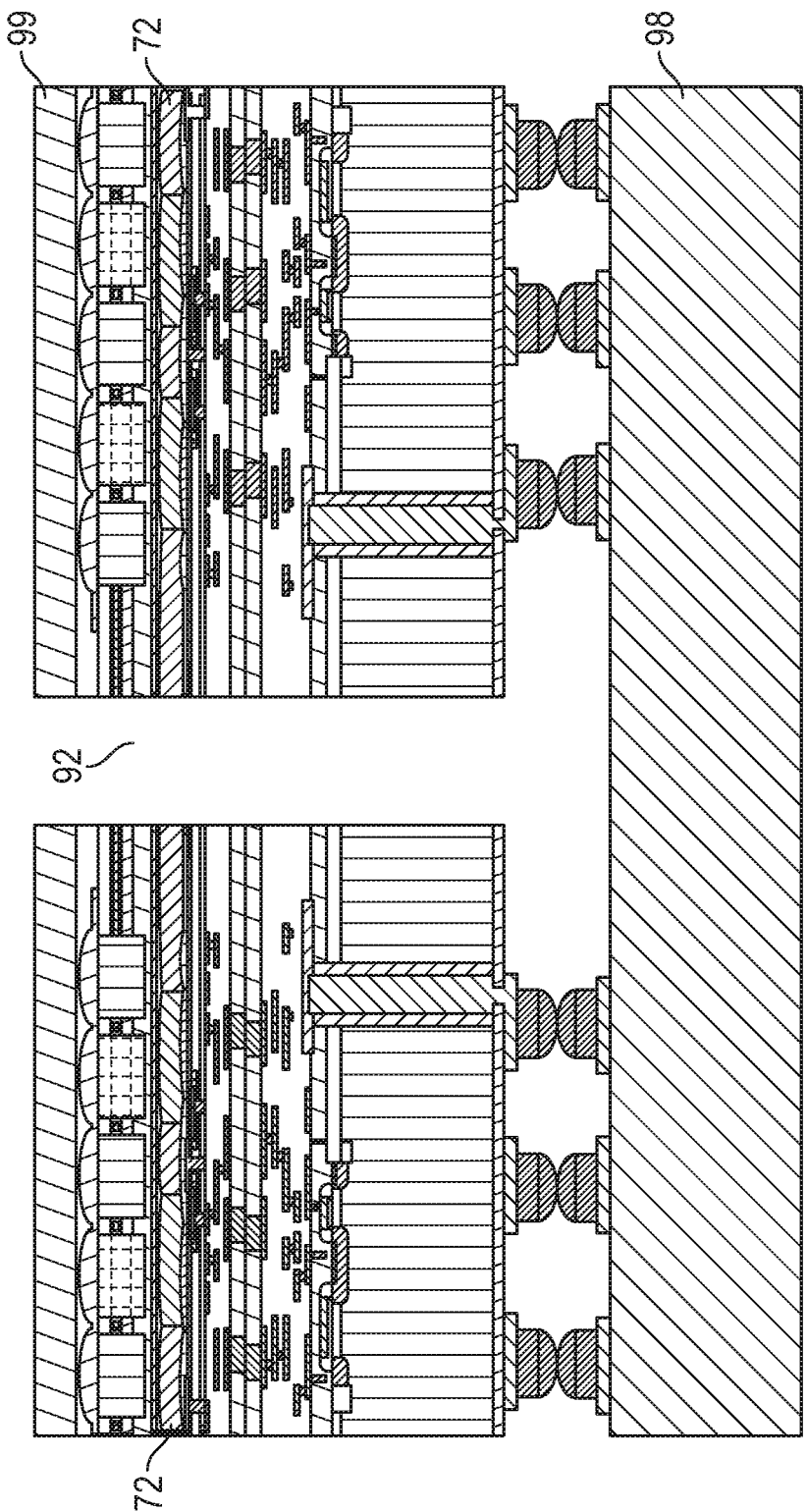
FIG. 15 is a side view of the substrate of FIG. 14 having the support layer removed.

Referring to FIG. 14, a side view of the substrate of FIG. 13 coupled to a flexible interconnect is illustrated. The method of forming the EMR sensing device may include coupling the second side 86 of the substrate 76 to a flexible interconnect 98. In particular implementations, the method may include coupling the second side 86 of the substrate to the flexible interconnect 98 through the plurality of contacts 96 and/or the plurality of contacts 100. The flexible interconnect may be any type of flexible interconnect disclosed herein and the plurality of contacts 100 may be any type of contacts disclosed herein. Though not illustrated, the method of forming the EMR sensing device may include coupling a digital section, including any type of section disclosed herein, to the flexible interconnect. In various implementations, the digital section may be electrically coupled to one or more EMR sensing die 72 through the flexible interconnect 98. Referring to FIG. 15, a side view of the substrate of FIG. 14 having the support layer removed is illustrated. In various implementations, the method of forming the EMR sensing device may include removing at least a portion of the support layer to more fully singulate the plurality of EMR sensing die 72. In various implementations, and as illustrated by FIG. 15, the entire support layer may be removed. In other implementations, the support layer may also serve as the optically transmissive cover. In such implementations, only portions of the support layer (or cover) corresponding with the trench 92 may be removed.

Figure 16:
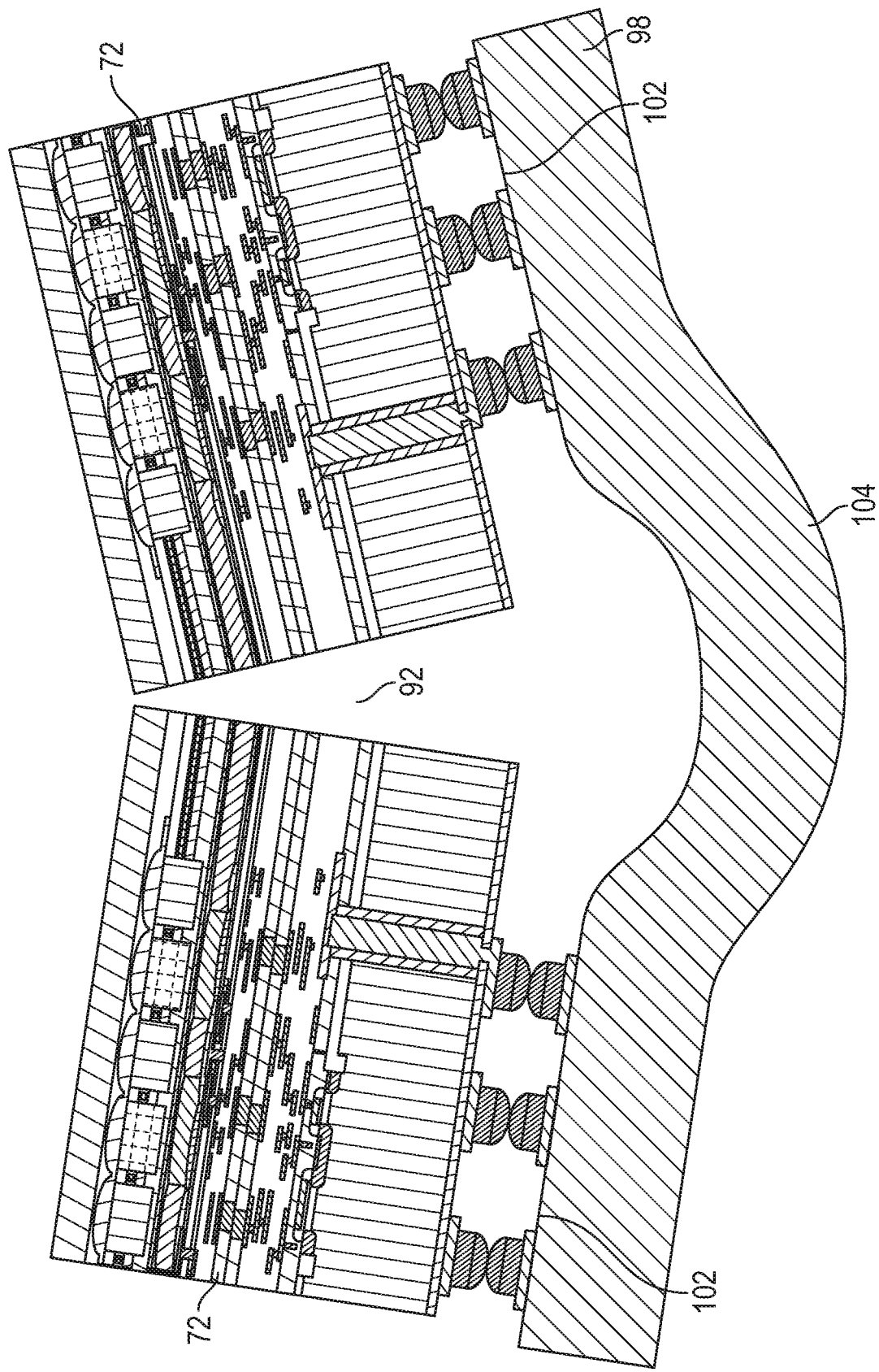
FIG. 16 is a side view of a plurality of sensing sections coupled to a flexible interconnect.

Referring to FIG. 16, a side view of a plurality of sensing sections coupled to a flexible interconnect is illustrated. The system illustrated by FIG. 16 may be the same as or similar to the system illustrated by FIG. 6. In various implementations, the method of forming the EMR sensing device may include bending the flexible interconnect 98 at a portion 104 of the flexible interconnect corresponding with the location of the trench 92. The method may include bending the interconnect to either form a concave (such as is illustrated by FIG. 16) or a convex surface of the EMR sensing system. In particular implementations, the method may include forming the flexible interconnect into a tube shape as illustrated by FIG. 1. As illustrated by FIG. 16, the method may include only bending the flexible interconnect at a portion 104 between the substantially straight portions 102 coupled to the plurality of sensing die 72. In various implementations, and as illustrated by FIG. 16, by bending the flexible interconnect 98 portions of the width of the trench 92 may decrease. Further, because the plurality of sensing die 72 are formed on the flexible interconnect, the plurality of sensing die may be self-aligned through the flexible interconnect 98.

In places where the description above refers to particular implementations of sensing devices and implementing components, sub-components, methods and sub-methods, it should be readily apparent that a number of modifications may be made without departing from the spirit thereof and that these implementations, implementing components, sub-components, methods and sub-methods may be applied to other sensing devices.

What is claimed is:

1. A method of forming an electromagnetic radiation (EMR) sensing device comprising:
    forming a plurality of EMR sensing die in a first side of substrate;
    forming a trench partially through the substrate from the first side of the substrate through removing a portion of the substrate between two EMR sensing die of the plurality of EMR sensing die;
    coupling a support layer to the first side of the substrate;
    singulating the plurality of EMR sensing die through thinning a second side of the substrate opposite the first side of the substrate;
    coupling the second side of the substrate to a flexible interconnect;
    removing at least a portion of the support layer to fully singulate the plurality of EMR sensing die; and
    bending the flexible interconnect at portions of the flexible interconnect corresponding with a location of the trench.

2. The method of claim 1, wherein the substrate comprises an EMR sensing layer hybrid bonded to an analog layer, wherein the first side of the substrate comprises a side of the EMR sensing layer and the second side of the substrate comprises a side of the analog layer.

3. The method of claim 2, further comprising forming a through-silicon-via at least partially through the analog layer and exposing the through-silicon-via when thinning the second side of the substrate.

4. The method of claim 1, further comprising forming the trench through patterning a photoresist layer over the first side of the substrate and etching into the first side of the substrate.

5. The method of claim 1, wherein the plurality of EMR sensing die each comprise a non-rectangular perimeter.

6. The method of claim 1, further comprising coupling a digital section to the flexible interconnect.

7. The method of claim 1, wherein the EMR sensing device comprises a complimentary metal-oxide semiconductor image sensor.

8. The method of claim 1, further comprising forming the flexible interconnect into a tube shape.

* * * * *